(12) United States Patent
Park

(10) Patent No.: US 12,203,987 B2
(45) Date of Patent: Jan. 21, 2025

(54) RELAY DIAGNOSIS APPARATUS, RELAY DIAGNOSIS METHOD, BATTERY SYSTEM AND ELECTRIC VEHICLE

(71) Applicant: LG Energy Solution, Ltd., Seoul (KR)

(72) Inventor: Jong-Il Park, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 217 days.

(21) Appl. No.: 17/772,210

(22) PCT Filed: May 25, 2021

(86) PCT No.: PCT/KR2021/006519
§ 371 (c)(1),
(2) Date: Apr. 27, 2022

(87) PCT Pub. No.: WO2021/251653
PCT Pub. Date: Dec. 16, 2021

(65) Prior Publication Data
US 2022/0404418 A1 Dec. 22, 2022

(30) Foreign Application Priority Data

Jun. 8, 2020 (KR) .......................... 10-2020-0069206

(51) Int. Cl.
*G01R 31/327* (2006.01)
*B60L 3/00* (2019.01)
(Continued)

(52) U.S. Cl.
CPC .......... *G01R 31/327* (2013.01); *B60L 3/0046* (2013.01); *B60L 58/18* (2019.02); *G01R 31/3842* (2019.01); *B60L 2240/547* (2013.01)

(58) Field of Classification Search
CPC ................ G01R 31/27; G01R 31/3842; G01R 31/3278; G01R 1/206; G01R 1/203; B60L 3/0046
See application file for complete search history.

(56) References Cited

U.S. PATENT DOCUMENTS

2004/0061503 A1 4/2004 Morimoto
2006/0021098 A1 1/2006 Tezuka
(Continued)

FOREIGN PATENT DOCUMENTS

EP 1610355 A1 12/2005
EP 2833498 A1 2/2015
(Continued)

OTHER PUBLICATIONS

International Search Report for PCT/KR2021/006519 dated Sep. 23, 2021. 3 pgs.
(Continued)

*Primary Examiner* — Dominic E Hawkins
(74) *Attorney, Agent, or Firm* — Lerner David LLP

(57) ABSTRACT

A relay diagnosis apparatus for a parallel pack assembly including a first battery pack having a first battery module and a first positive relay and a second battery pack having a second battery module and a second positive relay includes a diagnosis unit including a diagnosis switch and a diagnosis resistor connected between first and second battery pack terminals, a first detector to detect a current of the first battery module, a second detector to detect a current of the second battery module, and a control unit to collect a first and second detection values from the first and second detectors, respectively, during a first diagnosis period in which the first and second positive relays are open and the diagnosis switch is closed. The control unit determines a stuck-closed fault of the first or second positive relays based on the first and second detection values and a first threshold.

10 Claims, 5 Drawing Sheets

(51) Int. Cl.
*B60L 58/18* (2019.01)
*G01R 31/3842* (2019.01)

(56) References Cited

U.S. PATENT DOCUMENTS

| | | | |
|---|---|---|---|
| 2008/0088279 A1 | 4/2008 | Lim et al. | |
| 2013/0093427 A1 | 4/2013 | Bemrich et al. | |
| 2015/0054516 A1 | 2/2015 | Iisaka | |
| 2015/0270081 A1 | 9/2015 | Hartl | |
| 2016/0285380 A1 | 9/2016 | Toda et al. | |
| 2017/0160334 A1* | 6/2017 | Kawanaka | B60L 53/50 |
| 2018/0188326 A1 | 7/2018 | Huh et al. | |
| 2018/0299500 A1 | 10/2018 | Lee | |
| 2019/0267679 A1 | 8/2019 | Lee | |
| 2020/0116791 A1* | 4/2020 | Song | G01R 31/52 |
| 2020/0185936 A1* | 6/2020 | Oishi | H02J 7/0024 |
| 2020/0225275 A1* | 7/2020 | Du | G01R 31/52 |
| 2020/0355746 A1* | 11/2020 | Ham | G01R 31/3277 |

FOREIGN PATENT DOCUMENTS

| | | | |
|---|---|---|---|
| EP | 3324196 | A1 | 5/2018 |
| EP | 3451003 | A2 | 3/2019 |
| JP | 3945630 | B2 | 7/2007 |
| JP | 2010254038 | A * | 11/2010 |
| JP | 2013207961 | A | 10/2013 |
| JP | 2015084621 | A | 4/2015 |
| JP | 5732570 | B2 | 6/2015 |
| JP | 2018536855 | A | 12/2018 |
| JP | 2019204787 | A | 11/2019 |
| KR | 20080034352 | A | 4/2008 |
| KR | 20180115530 | A | 10/2018 |
| KR | 101926195 | B1 | 2/2019 |
| KR | 102044598 | B1 | 11/2019 |

OTHER PUBLICATIONS

Extended European Search Report for Application No. 21822358.4 dated Jun. 16, 23. 11 pgs.

* cited by examiner (a)

(b)

(a)

(b)

RELAY DIAGNOSIS APPARATUS, RELAY DIAGNOSIS METHOD, BATTERY SYSTEM AND ELECTRIC VEHICLE

CROSS-REFERENCE TO RELATED APPLICATIONS

The present application is a national phase entry under 35 U.S.C. § 371 of International Application No. PCT/KR2021/006519 filed May 25, 2021, published in Korean, which claims priority from Korean Patent Application No. 10-2020-0069206 filed Jun. 8, 2020, all of which are incorporated herein by reference.

TECHNICAL FIELD

The present disclosure relates to fault diagnosis technology for a relay assembly provided in each of a plurality of battery packs connected in parallel.

The present application claims the benefit of Korea patent Application No. 10-2020-0069206 filed on Jun. 8, 2020 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be charged and discharged repeatedly.

Currently, commercially available batteries include nickel-cadmium batteries, nickel-hydrogen batteries, nickel-zinc batteries, lithium batteries and the like, and among them, lithium batteries have hale or no memory effect, and thus they are gaining more attention than nickel-based batteries for their advantages that recharging can be done whenever it is convenient, the self-discharge rate is very low and the energy density is high.

A battery system mounted in an electric vehicle may include a parallel pack assembly including a plurality of battery packs connected in parallel to meet the demand for high capacity such as long distance driving.

It is necessary to diagnose a fault of a relay responsible for connection and separation of each battery pack and an electrical load.

When the battery system includes only one battery pack, a fault of the relay may be detected based on voltage at the load side contact of the relay provided in the battery pack.

However, in the parallel pack assembly, the load side contacts of a plurality of relays provided in each of the plurality of battery packs are connected in common to one another. Accordingly, it is possible to identify that at least one of the plurality of relays has a fault based on voltages at the load side contacts, but it is impossible to accurately identify which relay has the fault.

SUMMARY

Technical Problem

The present disclosure is designed to solve the above-described problem, and therefore the present disclosure is directed to providing a relay diagnosis apparatus, a relay diagnosis method, a battery system and an electric vehicle for individually diagnosing a fault of a plurality of relays provided in a plurality of battery packs of a parallel pack assembly.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A relay diagnosis apparatus according to an aspect of the present disclosure is for a parallel pack assembly including a first battery pack having a first battery module and a first positive relay connected in series and a second battery pack having a second battery module and a second positive relay connected in series. The relay diagnosis apparatus includes a diagnosis unit including a diagnosis switch and a diagnosis resistor connected in series between a first battery pack terminal and a second battery pack terminal of the parallel pack assembly, a first detector configured to detect a first module current which is an electric current flowing through the first battery module, a second detector configured to detect a second module current which is an electric current flowing through the second battery module, and a control unit operably coupled to the first positive relay, the second positive relay, the diagnosis switch, the first detector and the second detector. The control unit is configured to collect a first detection value from the first detector and a second detection value from the second detector during a first diagnosis period, wherein the first positive relay and the second positive relay are in an open operational state and the diagnosis switch is in a closed operational state during the first diagnosis period. The control unit is configured to determine whether the first positive relay has a stuck-closed fault based on the first detection value and a first threshold. The control unit is configured to determine whether the second positive relay has the stuck-closed fault based on the second detection value and the first threshold.

The control unit may be configured to determine that the first positive relay has the stuck-closed fault in response to the first detection value being larger than the first threshold.

The control unit may be configured to determine that the second positive relay has the stuck-closed fault in response to the second detection value being larger than the first threshold.

The relay diagnosis apparatus may further include a third detector configured to detect a first module voltage which is a voltage across the first battery module, and a fourth detector configured to detect a second module voltage which is a voltage across the second battery module.

The control unit may be configured to collect a third detection value from the third detector and a fourth detection value from the fourth detector during the first diagnosis period. The control unit may be configured to collect a fifth detection value from the third detector and a sixth detection value from the fourth detector during a second diagnosis period, wherein the first positive relay and the second positive relay are in the open operational state and the diagnosis switch is in the open operational state during the second diagnosis period. The control unit may be configured to determine whether the first positive relay has the stuck-closed fault based on the first detection value, the third detection value, the fifth detection value, the first threshold and a second threshold. The control unit may be configured to determine whether the second positive relay has the stuck-closed fault based on the second detection value, the fourth detection value, the sixth detection value, the first threshold and the second threshold.

The control unit may be configured to determine that the first positive relay has the stuck-closed fault in response to the first detection value being larger than the first threshold and a difference between the third detection value and the fifth detection value being larger than the second threshold.

The control unit may be configured to determine that the second positive relay has the stuck-closed fault in response to the second detection value being larger than the first threshold and a difference between the fourth detection value and the sixth detection value being larger than the second threshold.

A battery system according to another aspect of the present disclosure includes the relay diagnosis apparatus of any of the embodiments described herein.

An electric vehicle according to still another aspect of the present disclosure includes the battery system.

A relay diagnosis method for a parallel pack assembly including a first battery pack having a first battery module and a first positive relay connected in series and a second battery pack having a second battery module and a second positive relay connected in series includes collecting, by a control unit, a first detection value from a first detector detecting a first module current which is an electric current flowing through the first battery module, and a second detection value from a second detector detecting a second module current which is an electric current flowing through the second battery module during a first diagnosis period during which the first positive relay and the second positive relay are in an open operational state and a diagnosis switch between a first battery pack terminal and a second battery pack terminal is in a closed operational state, determining, by the control unit, whether the first positive relay has a stuck-closed fault based on the first detection value and a first threshold, and determining, by the control unit, whether the second positive relay has the stuck-closed fault based on the second detection value and the first threshold.

Advantageous Effects

According to at least one of the embodiments of the present disclosure, it is possible to individually diagnose a fault of the plurality of relays provided in the plurality of battery packs of the parallel pack assembly.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
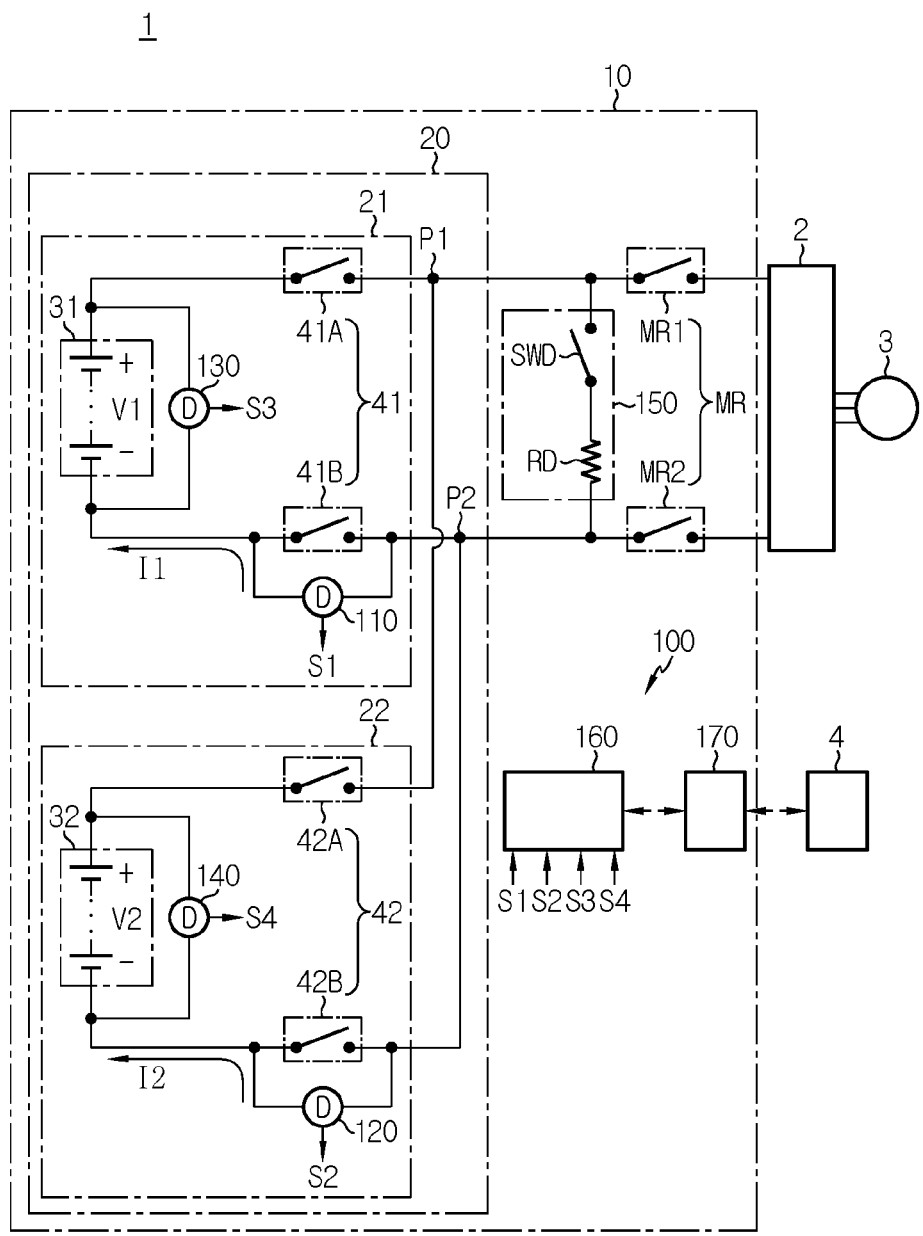
FIG. 1 is a diagram exemplarily showing a configuration of a power system according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

Figure 2:
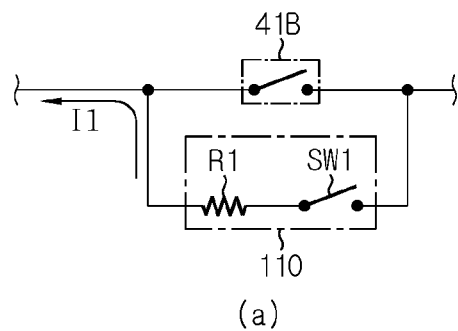
FIG. 2 is a diagram exemplarily showing a configuration of a first detector and a second detector of FIG. 1.
Figure 2:
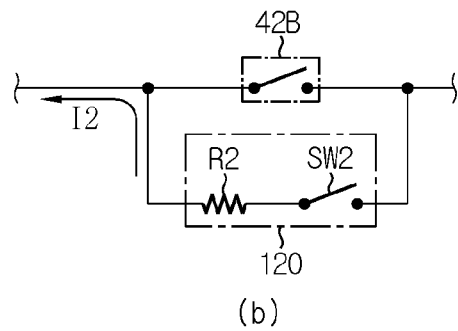
Figure 3:
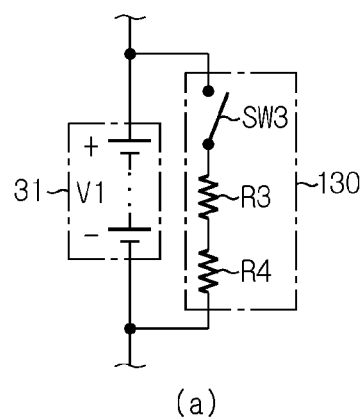
FIG. 3 is a diagram exemplarily showing a configuration of a third detector and a fourth detector of FIG. 1.
Figure 3:
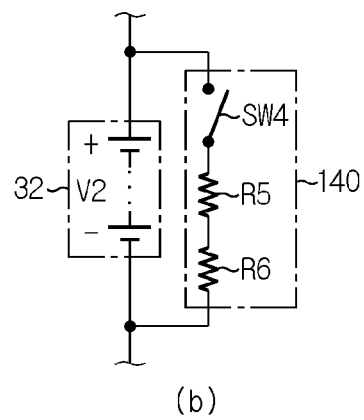

FIG. 1 is a diagram exemplarily showing a configuration of a power system according to the present disclosure, FIG. 2 is a diagram exemplarily showing a configuration of a first detector and a second detector of FIG. 1, and FIG. 3 is a diagram exemplarily showing a configuration of a third detector and a fourth detector of FIG. 1.

Referring to FIG. 1, the power system 1 may be, for example, an energy storage system and an electric vehicle. The power system 1 includes a battery system 10, an inverter 2 and an electrical load 3. The electrical load 3, may be, for example, an electric motor.

The battery system 10 includes a parallel pack assembly 20 and a relay diagnosis apparatus 100. The battery system 10 may further include a main relay assembly MR. In the specification, the parallel pack assembly 20 refers to a pack group including a parallel circuit of at least two battery packs, i.e., a first battery pack 21 and a second battery pack 22, connected in parallel.

The main relay assembly MR may be connected between a pair of pack terminals P1, P2 provided in the parallel pack assembly 20 and a pair of power terminals provided in the inverter 2. The main relay assembly MR includes a first main relay MR1. The two contacts of the first main relay MR1 are connected to the first pack terminal P1 and one of the pair of power terminals, respectively. The main relay assembly MR may further include a second main relay MR2. The two contacts of the second main relay MR2 are connected to the second pack terminal P2 and the other of the pair of power terminals, respectively.

The inverter 2 converts direct current (DC) power supplied from the parallel pack assembly 20 to alternating current (AC) power and supplies it to the electrical load 3.

The first battery pack 21 includes a first battery module 31 and a first relay assembly 41. The first battery module 31 includes a plurality of battery cells electrically connected in series and/or in parallel.

The first relay assembly 41 is connected in series to the first battery module 31. The first relay assembly 41 includes a first positive relay 41A. The two contacts of the first positive relay 41A are connected to a positive electrode terminal of the first battery module 31 and the first pack terminal P1, respectively. The first relay assembly 41 may further include a first negative relay 41B. The two contacts of the first negative relay 41B are connected to a negative electrode terminal of the first battery module 31 and the second pack terminal P2, respectively.

The second battery pack 22 includes a second battery module 32 and a second relay assembly 42. The second battery module 32 includes a plurality of battery cells electrically connected in series and/or in parallel.

The second relay assembly 42 is connected in series to the second battery module 32. The second relay assembly 42 includes a second positive relay 42A. The two contacts of the second positive relay 42A are connected to a positive electrode terminal of the second battery module 32 and the first pack terminal P1, respectively. The second relay assembly 42 may further include a second negative relay 42B. The two contacts of the second negative relay 42B are connected to a negative electrode terminal of the second battery module 32 and the second pack terminal P2, respectively.

Each battery cell of the first battery module 31 and the second battery module 32 is not limited to a particular type, and includes any type of battery that can be charged and discharged repeatedly, such as, for example, a lithium ion cell.

The relay diagnosis apparatus 100 includes a first detector 110, a second detector 120, a diagnosis unit 150 and a control unit 160. The relay diagnosis apparatus 100 may further include at least one of a third detector 130, a fourth detector 140 or an interface unit 170.

The diagnosis unit 150 is connected between the first pack terminal P1 and the second pack terminal P2. The diagnosis unit 150 includes a diagnosis switch SWD and a diagnosis resistor RD connected in series. The diagnosis switch SWD may include a well-known switching device such as, for example, a Field Effect Transistor (FET). When the main relay assembly MR is in an open operational state, the diagnosis unit 150 may serve to provide an electric current path between the first pack terminal P1 and the second pack terminal P2.

The first detector 110 is configured to detect a first module current I1 which is an electric current flowing through the first battery module 31. The first detector 110 may be installed on a negative electrode side line of the first battery module 31. The first detector 110 generates a detection signal S1 indicating the first module current I1.

The second detector 120 is configured to detect a second module current I2 which is an electric current flowing through the second battery module 32. The second detector 120 may be installed on a negative electrode side line of the second battery module 32. The second detector 120 generates a detection signal S1 indicating the second module current I2.

Referring to FIG. 2, when the first relay assembly 41 includes the first negative relay 41B, the first detector 110 may be connected in parallel to the first negative relay 41B. The first detector 110 may include a first resistor R1 and a first switch SW1. A series circuit of the first resistor R1 and the first switch SW1 may be connected in parallel to the first negative relay 41B. When the first relay assembly 41 does not include the first negative relay 41B, the first switch SW1 may be removed from the first detector 110. In this case, the first resistor R1 may be connected in series between the negative electrode terminal of the first battery module 31 and the second pack terminal P2.

When the second relay assembly 42 includes the second negative relay 42B, the second detector 120 may be connected in parallel to the second negative relay 42B. The second detector 120 may include a second resistor R2 and a second switch SW2. A series circuit of the second resistor R2 and the second switch SW2 may be connected in parallel to the second negative relay 42B. When the second relay assembly 42 does not include the second negative relay 42B, the second switch SW2 may be removed from the second detector 120. In this case, the second resistor R2 may be connected in series between the negative electrode terminal of the second battery module 32 and the second pack terminal P2.

The third detector 130 is configured to detect a first module voltage V1 which is a voltage across the first battery module 31. The third detector 130 generates a detection signal S3 indicating the first module voltage V1. Referring to FIG. 3, the third detector 130 may include a third switch SW3, a third resistor R3 and a fourth resistor R4. A series circuit of the third switch SW3, the third resistor R3 and the fourth resistor R4 may be connected in parallel to the first battery module 31. The control unit 160 may control the third switch SW3 into a closed operational state to generate a detection signal S3 indicating the first module voltage V1. When the third switch SW3 is controlled into the closed operational state, the control unit 160 may determine the first module voltage V1 from a voltage across the third resistor R3 or the fourth resistor R4. The closed operational state refers to an On-state in which a flow of electric current is allowed.

The fourth detector 140 is configured to detect a second module voltage V2 which is a voltage across the second battery module 32. The fourth detector 140 generates a detection signal S4 indicating the second module voltage V2. Referring to FIG. 3, the fourth detector 140 may include a fourth switch SW4, a fifth resistor R5 and a sixth resistor R6. A series circuit of the fourth switch SW4, the fifth resistor R5 and the sixth resistor R6 may be connected in parallel to the second battery module 32. The control unit 160 may control the fourth switch SW4 into the closed operational state to generate a detection signal S4 indicating the second module voltage V2. When the fourth switch SW4 is controlled into the closed operational state, the control unit 160 may determine the second module voltage V2 from a voltage across the fifth resistor R5 or the sixth resistor R6.

The interface unit 170 is configured to support wired or wireless communication between the control unit 160 and a high level controller 4 (for example, an Electronic Control Unit (ECU)). The high level controller 4 is provided to manage the entire operation of the power system 1. The communication protocol is not limited to a particular type, and the wired communication may be, for example, controller area network (CAN) communication, and the wireless communication may be, for example, Zigbee or Bluetooth communication. The interface unit 170 may include an output device such as a display and a speaker to provide information corresponding to a message from the control unit 160 in a recognizable format.

The control unit 160 is operably coupled to the first positive relay 41A, the second positive relay 42A, the diagnosis switch SWD, the first detector 110 and the second detector 120. The operably coupled refers to direct/indirect connection to enable signal transmission and reception in one or two directions. The control unit 160 may be further operably coupled to the third detector 130, the fourth detector 140 and the interface unit 170. The control unit 160 may be further operably coupled to the first main relay MR1, the second main relay MR2, the first negative relay 41B and the second negative relay 42B. That is, the control unit 160 may receive the detection signal from each detector included in the relay diagnosis apparatus 100, and control the on/off of each relay and each switch.

The control unit 160 may be referred to as a 'control circuit', and may be implemented, in hardware, using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 160 may include a memory embedded therein. The memory may store programs and data necessary to perform methods as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The control unit 160 may control the main relay assembly MR into an open operational state in response to a command from the high level controller 4 mounted in the power system 1. The open operational state refers to an Off-state in which a flow of electric current is interrupted. Of course, alternatively, the on/off of the main relay assembly MR may be controlled by the power system 1.

The control unit 160 may perform one of a first diagnosis process and a second diagnosis process as described below for detecting a fault of at least one of the first positive relay 41A or the second positive relay 42A while the main relay assembly MR is being controlled into the open operational state.

First Diagnosis Process

The first diagnosis process is a process for diagnosing a stuck-closed fault of each of the first positive relay 41A and the second positive relay 42A using the first detector 110 and the second detector 120. The stuck-closed fault is a fault that the switching from the closed operational state to the open operational state is impossible, for example, due to contact fusion, and when a signal commanding the open operational state is inputted to the corresponding relay, the closed operational state is maintained. The stuck-closed fault may be referred to as a 'short circuit fault'.

The first diagnosis process may be used when the relay diagnosis apparatus 100 does not include the third detector 130 and the fourth detector 140.

The control unit 160 may control the first positive relay 41A and the second positive relay 42A into the open operational state and the diagnosis switch SWD into the closed operational state during a first diagnosis period in response to a relay diagnosis command from the high level controller 4. The first diagnosis period may have a predetermined length of time. The control unit 160 may control the first switch SW1 and the second switch SW2 into the closed operational state during the first diagnosis period.

When the first relay assembly 41 includes the first negative relay 41B, the control unit 160 may control the first negative relay 41B into the open operational state during the first diagnosis period. When the second relay assembly 42 includes the second negative relay 42B, the control unit 160 may control the second negative relay 42B into the open operational state during the first diagnosis period.

When the first positive relay 41A has the stuck-closed fault, a closed circuit is formed by the first battery module 31, the first positive relay 41A, the diagnosis switch SWD, the diagnosis resistor RD and the first detector 110 during the first diagnosis period. Accordingly, the first module current I1 that is larger than 0 A (ampere) flows through the first detector 110.

When the second positive relay 42A has the stuck-closed fault, a closed circuit is formed by the second battery module 32, the second positive relay 42A, the diagnosis switch SWD, the diagnosis resistor RD and the second detector 120 during the first diagnosis period. Accordingly, the second module current I2 that is larger than 0A flows through the second detector 120.

The control unit 160 collects (determines) a first detection value from the first detector 110 and a second detection value from the second detector 120 based on the detection signal S1 and the detection signal S2 within the first diagnosis period. The first detection value may be proportional to the magnitude of the first module current I1. The first detection value may indicate a voltage across the first resistor R1 in the first diagnosis period. The second detection value may be proportional to the magnitude of the second module current I2. The second detection value may indicate a voltage across the second resistor R2 in the first diagnosis period.

The control unit 160 may determine whether the first positive relay 41A has the stuck-closed fault based on the first detection value and a first threshold. The control unit 160 may determine whether the second positive relay 42A has the stuck-closed fault based on the second detection value and the first threshold.

The first threshold is a predetermined value used to determine whether each of the first battery module 31 and the second battery module 32 is completely electrically separated from the diagnosis unit 150 during the first diagnosis period. That is, the first threshold is used to detect whether the first module current I1 and the second module current I2 are interrupted by the first positive relay 41A and the second positive relay 42A, respectively.

When the first positive relay 41A is normally controlled into the open operational state, the first module current I1 is completely interrupted by the first positive relay 41A, and the voltage across the first resistor R1 will be 0 V. Additionally, when the second positive relay 42A is normally controlled into the open operational state, the second module current I2 is completely interrupted by the second positive relay 42A, and the voltage across the second resistor R2 will be 0 V. Accordingly, the first threshold may be set to 0 V. Alternatively, the first threshold may be set to a predetermined value (for example, 0.01 V) that is larger than 0 V considering the voltage resolution of the control unit 160 and/or measurement noise.

The first detection value larger than the first threshold indicates that the first module current I1 is flowing while the first positive relay 41A is being controlled into the open operational state. Accordingly, when the first detection value is larger than the first threshold, the control unit 160 determines that the first positive relay 41A has the stuck-closed fault.

The second detection value larger than the first threshold indicates that the second module current I2 is flowing while the second positive relay 42A is being controlled into the open operational state. Accordingly, when the second detection value is larger than the first threshold, the control unit 160 determines that the second positive relay 42A has the stuck-closed fault.

Second Diagnosis Process

The second diagnosis process is a process for diagnosing the stuck-closed fault of each of the first positive relay 41A and the second positive relay 42A using the first detector 110, the second detector 120, the third detector 130 and the fourth detector 140. The second diagnosis process may be used when the relay diagnosis apparatus 100 further includes the third detector 130 and the fourth detector 140. Of course, when the relay diagnosis apparatus 100 includes the third detector 130 and the fourth detector 140, the first diagnosis process may be performed instead of the second diagnosis process.

In describing the second diagnosis process, a repetitive description of the same terminology as the first diagnosis process is omitted herein. The control unit 160 may control the first switch SW1, the second switch SW2, the third switch SW3 and the fourth switch SW4 into the closed operational state during the first diagnosis period.

The control unit 160 determines the first detection value from the first detector 110, the second detection value from the second detector 120, a third detection value from the third detector 130 and a fourth detection value from the fourth detector 140 based on the detection signal S1, the detection signal S2, the detection signal S3 and the detection signal S4 within the first diagnosis period. The third detection value may indicate the first module voltage V1 of the first battery module 31 in the first diagnosis period. The fourth detection value may indicate the second module voltage V2 of the second battery module 32 in the first diagnosis period.

The control unit 160 may control the first positive relay 41A and the second positive relay 42A into the open operational state and the diagnosis switch SWD into the open operational state during a second diagnosis period. The second diagnosis period may be a period having a predetermined length of time before the starting time of the first diagnosis period or after the ending time of the first diagnosis period.

The control unit 160 may control the third switch SW3 and the fourth switch SW4 into the closed operational state during the second diagnosis period. During the second diagnosis period, the diagnosis switch SWD is kept in the open operational state. Accordingly, even if the first positive relay 41A has the stuck-closed fault, the first module current I1 will be interrupted, and even if the second positive relay 42A has the stuck-closed fault, the second module current I2 will be interrupted.

The control unit 160 determines a fifth detection value from the third detector 130 and a sixth detection value from the fourth detector 140 based on the detection signal S3 and the detection signal S4 within the second diagnosis period. The fifth detection value may indicate the first module voltage V1 of the first battery module 31 in the second diagnosis period. The sixth detection value may indicate the second module voltage V2 of the second battery module 32 in the second diagnosis period. The fifth detection value and the sixth detection value may indicate an open circuit voltage (OCV) of the first battery module 31 and an OCV of the second battery module 32, respectively.

When the first relay assembly 41 includes the first negative relay 41B, the control unit 160 may control the first negative relay 41B into the open operational state and the first switch SW1 into the closed operational state during the second diagnosis period.

When the second relay assembly 42 includes the second negative relay 42B, the control unit 160 may control the second negative relay 42B into the open operational state and the second switch SW2 into the closed operational state during the second diagnosis period.

The control unit 160 determines whether the first positive relay 41A has the stuck-closed fault based on the first detection value, the first threshold, the third detection value, the fifth detection value and a second threshold.

The second threshold is a predetermined value used to further determine whether each of the first battery module 31 and the second battery module 32 is completely electrically separated from the diagnosis unit 150 during the first diagnosis period based on a voltage drop associated with the internal resistance of the battery. The voltage drop is an instantaneous change in the voltage across the battery by the magnitude corresponding to the multiplication of the current of the battery and the internal resistance of the battery according to the Ohm's law.

When the first positive relay 41A is normally controlled into the open operational state, irrespective of whether the diagnosis switch SWD is in the closed operational state or the open operational state, the first module current I1 is interrupted (for example, maintained at 0 A). That is, when the first positive relay 41A is normally controlled into the open operational state, a voltage drop of the first battery module 31 by the first module current I1 does not occur in case that the operational state of the diagnosis switch SWD changes.

In contrast, when the first positive relay 41A has the stuck-closed fault, the first module current I1 is not interrupted. Accordingly, the first module voltage V1 of the first battery module 31 instantaneously changes in response to the switching of the diagnosis switch SWD from the open operational state to the closed operational state or from the closed operational state to the open operational state.

When the second positive relay 42A is normally controlled into the open operational state, irrespective of whether the diagnosis switch SWD is in the closed operational state or the open operational state, the second module current I2 is interrupted. That is, when the second positive relay 42A is normally controlled into the open operational state, a voltage drop of the second battery module 32 by the second module current I2 does not occur in case that the operational state of the diagnosis switch SWD changes.

In contrast, when the second positive relay 42A has the stuck-closed fault, the second module current I2 is not interrupted. Accordingly, the second module voltage V2 of the second battery module 32 instantaneously changes in response to the switching of the diagnosis switch SWD from the open operational state to the closed operational state or from the closed operational state to the open operational state.

A difference between the third detection value and the fifth detection value that is larger than the second threshold indicates that the first module current I1 cannot be interrupted by the first positive relay 41A. Accordingly, when the first detection value is larger than the first threshold and a difference between the third detection value and the fifth detection value is larger than the second threshold, the control unit 160 determines that the first positive relay 41A has the stuck-closed fault.

A difference between the fourth detection value and the sixth detection value that is larger than the second threshold indicates that the second module current I2 cannot be interrupted by the second positive relay 42A. Accordingly, when the second detection value is larger than the first threshold and a difference between the fourth detection value and the sixth detection value is larger than the second threshold, the control unit 160 determines that the second positive relay 42A has the stuck-closed fault.

After the first diagnosis process or the second diagnosis process is completed, the control unit 160 may transmit a diagnosis message indicating whether each of the first positive relay 41A and the second positive relay 42A has the stuck-closed fault to the high level controller 4 through the interface unit 170. When the diagnosis message indicates that at least one of the first positive relay 41A or the second positive relay 42A has the stuck-closed fault, the high level controller 4 may transmit a closed prohibition command for the main relay assembly MR to the control unit 160.

Figure 4:
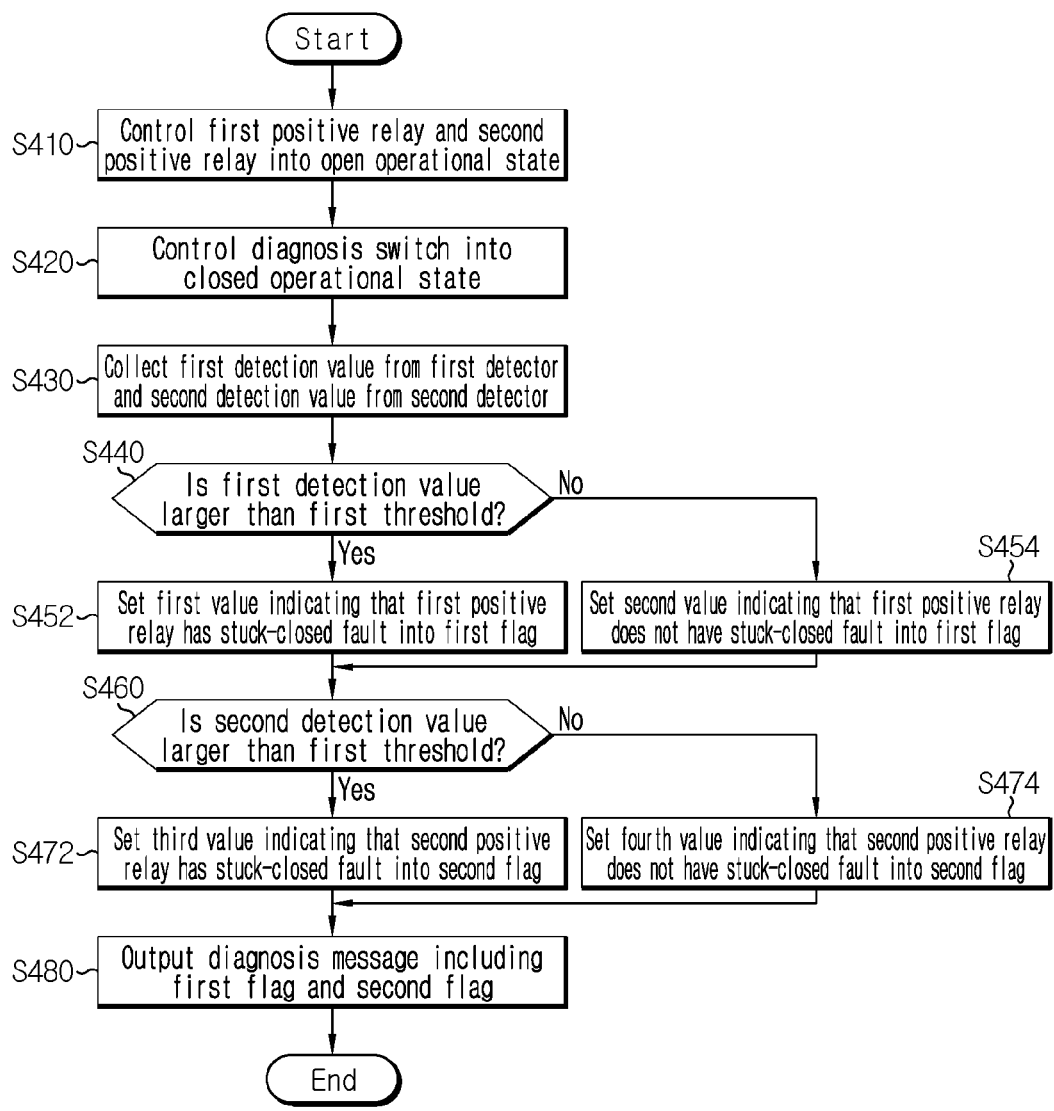
FIG. 4 is a flowchart exemplarily showing a relay diagnosis method according to a first embodiment.

FIG. 4 is a flowchart exemplarily showing a relay diagnosis method according to a first embodiment. The method of FIG. 4 corresponds to the first diagnosis process.

Referring to FIGS. 1, 2 and 4, in step S410, the control unit 160 controls the first positive relay 41A and the second positive relay 42A into the open operational state. When the first relay assembly 41 includes the first negative relay 41B, the control unit 160 may control the first negative relay 41B into the open operational state. When the second relay assembly 42 includes the second negative relay 42B, the control unit 160 may control the second negative relay 42B into the open operational state.

In step S420, the control unit 160 controls the diagnosis switch SWD into the closed operational state.

In step S430, the control unit 160 collects the first detection value from the first detector 110 and the second detection value from the second detector 120.

In step S440, the control unit 160 determines whether the first detection value is larger than the first threshold. When a value of the step S440 is "Yes", step S452 is performed. When the value of the step S440 is "No", step S454 is performed.

In step S452, the control unit 160 sets a first value indicating that the first positive relay 41A has the stuck-closed fault into a first flag.

In step S454, the control unit 160 sets a second value indicating that the first positive relay 41A does not have the stuck-closed fault into the first flag.

In step S460, the control unit 160 determines whether the second detection value is larger than the first threshold. When a value of the step S460 is "Yes", step S472 is performed. When the value of the step S460 is "No", step S474 is performed.

In step S472, the control unit 160 sets a third value indicating that the second positive relay 42A has the stuck-closed fault into a second flag. The third value may be equal to the first value.

In step S474, the control unit 160 sets a fourth value indicating that the second positive relay 42A does not have the stuck-closed fault into the second flag. The fourth value may be equal to the second value.

In step S480, the control unit 160 outputs a diagnosis message including the first flag and the second flag. The diagnosis message may be received by the interface unit 170. The interface unit 170 may output information corresponding to the diagnosis message to the user in response to the diagnosis message. The interface unit may transmit the diagnosis message to the high level controller 4.

Figure 5:
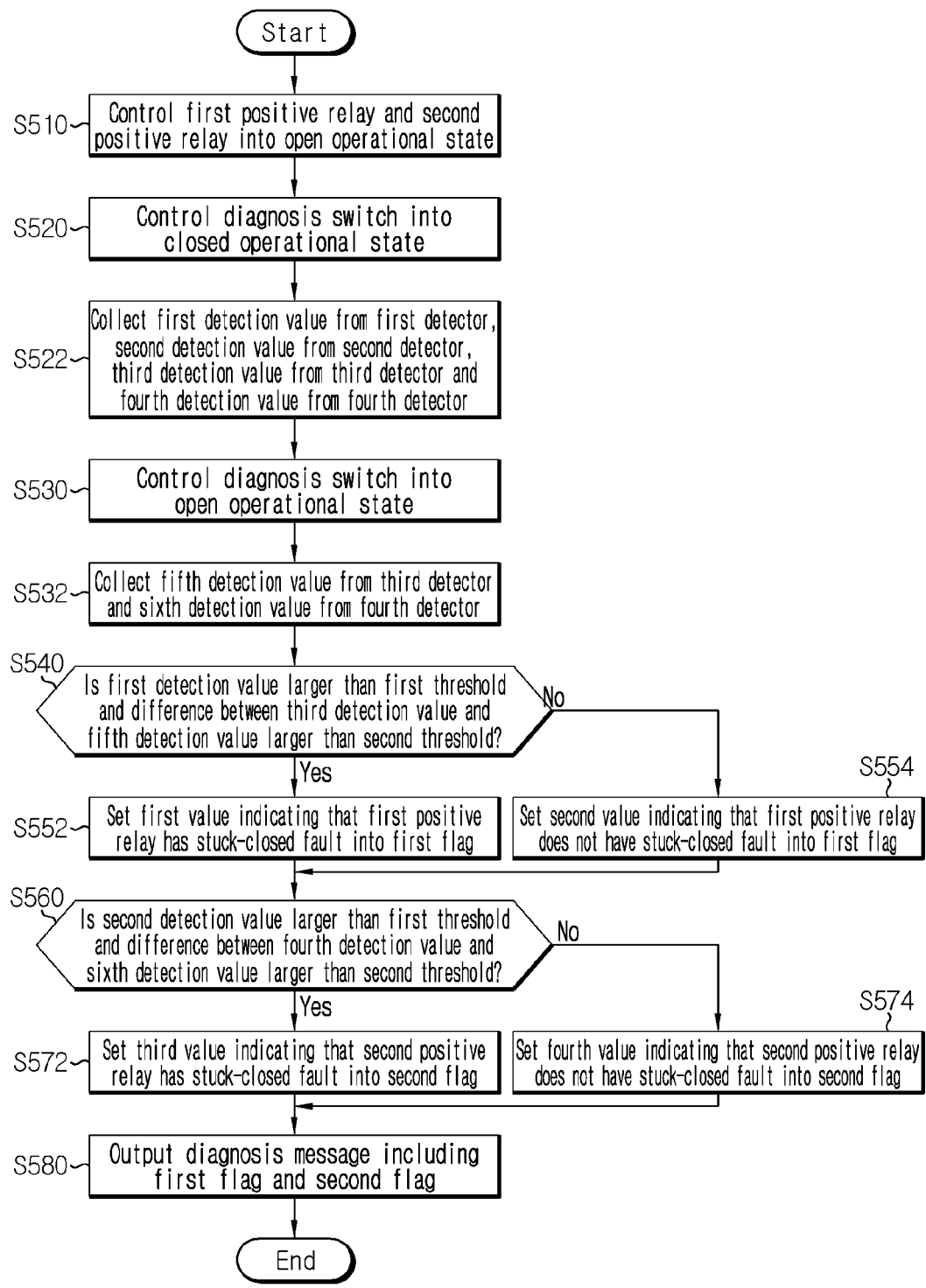
FIG. 5 is a flowchart exemplarily showing a relay diagnosis method according to a second embodiment.

FIG. 5 is a flowchart exemplarily showing a relay diagnosis method according to a second embodiment. The method of FIG. 5 corresponds to the second diagnosis process.

Referring to FIGS. 1, 2, 3 and 5, in step S510, the control unit 160 controls the first positive relay 41A and the second positive relay 42A into the open operational state. When the first relay assembly 41 includes the first negative relay 41B, the control unit 160 may control the first negative relay 41B into the open operational state. When the second relay assembly 42 includes the second negative relay 42B, the control unit 160 may control the second negative relay 42B into the open operational state.

In step S520, the control unit 160 controls the diagnosis switch SWD into the closed operational state.

In step S522, the control unit 160 collects the first detection value from the first detector 110, the second detection value from the second detector 120, the third detection value from the third detector 130 and the fourth detection value from the fourth detector.

In step S530, the control unit 160 controls the diagnosis switch SWD into the open operational state.

In step S532, the control unit 160 collects the fifth detection value from the third detector 130 and the sixth detection value from the fourth detector 140.

In step S540, the control unit 160 determines whether the first detection value is larger than the first threshold and a difference between the third detection value and the fifth detection value is larger than the second threshold. When a value of the step S540 is "Yes", step S552 is performed. When the value of the step S540 is "No", step S554 is performed.

In step S552, the control unit 160 sets the first value indicating that the first positive relay 41A has the stuck-closed fault into the first flag.

In step S554, the control unit 160 sets the second value indicating that the first positive relay 41A does not have the stuck-closed fault into the first flag.

In step S560, the control unit 160 determines whether the second detection value is larger than the first threshold and a difference between the fourth detection value and the sixth detection value is larger than the second threshold. When a value of the step S560 is "Yes", step S572 is performed. When the value of the step S560 is "No", step S574 is performed.

In step S572, the control unit 160 sets the third value indicating that the second positive relay 42A has the stuck-closed fault into the second flag. The third value may be equal to the first value.

In step S574, the control unit 160 sets the fourth value indicating that the second positive relay 42A does not have the stuck-closed fault into the second flag. The fourth value may be equal to the second value.

In step S580, the control unit 160 outputs a diagnosis message including the first flag and the second flag. The diagnosis message may be received by the interface unit 170. The interface unit 170 may output information corresponding to the diagnosis message to the user in response to the diagnosis message. The interface unit may transmit the diagnosis message to the high level controller 4.

Although FIGS. 4 and 5 describe that the first positive relay 41A is diagnosed earlier than the second positive relay 42A, the present disclosure is not limited thereto. For example, the second positive relay 42A may be diagnosed earlier than the first positive relay 41A, or the first positive relay 41A and the second positive relay 42A may be diagnosed at the same time.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A relay diagnosis apparatus for a parallel pack assembly including a first battery pack having a first battery module and a first positive relay connected in series along a first battery pack path and a second battery pack having a second battery module and a second positive relay connected in series along a second battery pack path in parallel to the first battery path, the relay diagnosis apparatus comprising:
    a diagnosis unit including a diagnosis switch and a diagnosis resistor connected in series between a first battery pack terminal and a second battery pack terminal of the parallel pack assembly;
    a first detector positioned on the first battery pack path and configured to detect a first module current which is an electric current flowing through the first battery module;
    a second detector positioned on the second battery pack path and configured to detect a second module current which is an electric current flowing through the second battery module; and
    a control unit operably coupled to the first positive relay, the second positive relay, the diagnosis switch, the first detector and the second detector,
    wherein the control unit is configured to:
    collect a first detection value from the first detector and a second detection value from the second detector during a first diagnosis period, wherein the first positive relay and the second positive relay are in an open operational state and the diagnosis switch is in a closed operational state during the first diagnosis period,
    determine whether the first positive relay has a stuck-closed fault based on the first detection value and a first threshold, and
    determine whether the second positive relay has the stuck-closed fault based on the second detection value and the first threshold.

2. The relay diagnosis apparatus according to claim 1, wherein the control unit is configured to determine that the first positive relay has the stuck-closed fault in response to the first detection value being larger than the first threshold.

3. The relay diagnosis apparatus according to claim 1, wherein the control unit is configured to determine that the second positive relay has the stuck-closed fault in response to the second detection value being larger than the first threshold.

4. A relay diagnosis apparatus for a parallel pack assembly including a first battery pack having a first battery module and a first positive relay connected in series and a second battery pack having a second battery module and a second positive relay connected in series, the relay diagnosis apparatus comprising:
    a diagnosis unit including a diagnosis switch and a diagnosis resistor connected in series between a first battery pack terminal and a second battery pack terminal of the parallel pack assembly;
    a first detector configured to detect a first module current which is an electric current flowing through the first battery module;
    a second detector configured to detect a second module current which is an electric current flowing through the second battery module; and
    a control unit operably coupled to the first positive relay, the second positive relay, the diagnosis switch, the first detector and the second detector,
    wherein the control unit is configured to:
    collect a first detection value from the first detector and a second detection value from the second detector during a first diagnosis period, wherein the first positive relay and the second positive relay are in an open operational state and the diagnosis switch is in a closed operational state during the first diagnosis period,
    determine whether the first positive relay has a stuck-closed fault based on the first detection value and a first threshold, and
    determine whether the second positive relay has the stuck-closed fault based on the second detection value and the first threshold,
    the relay diagnosis apparatus further comprising:
    a third detector configured to detect a first module voltage which is a voltage across the first battery module; and
    a fourth detector configured to detect a second module voltage which is a voltage across the second battery module.

5. The relay diagnosis apparatus according to claim 4, wherein the control unit is configured to:
    collect a third detection value from the third detector and a fourth detection value from the fourth detector during the first diagnosis period,
    collect a fifth detection value from the third detector and a sixth detection value from the fourth detector during a second diagnosis period, wherein the first positive relay and the second positive relay are in the open operational state and the diagnosis switch is in the open operational state during the second diagnosis period,
    determine whether the first positive relay has the stuck-closed fault based on the first detection value, the third detection value, the fifth detection value, the first threshold and a second threshold, and
    determine whether the second positive relay has the stuck-closed fault based on the second detection value, the fourth detection value, the sixth detection value, the first threshold and the second threshold.

6. The relay diagnosis apparatus according to claim 5, wherein the control unit is configured to determine that the first positive relay has the stuck-closed fault in response to the first detection value being larger than the first threshold and a difference between the third detection value and the fifth detection value being larger than the second threshold.

7. The relay diagnosis apparatus according to claim 5, wherein the control unit is configured to determine that the second positive relay has the stuck-closed fault in response to the second detection value being larger than the first threshold and a difference between the fourth detection value and the sixth detection value being larger than the second threshold.

8. A battery system comprising the relay diagnosis apparatus according to claim 1.

9. An electric vehicle comprising the battery system according to claim 8.

10. A relay diagnosis method for a parallel pack assembly including a first battery pack having a first battery module and a first positive relay connected in series along a first battery pack path and a second battery pack having a second battery module and a second positive relay connected in series along a second battery pack path in parallel to the first battery path, the relay diagnosis method comprising:

collecting, by a control unit, a first detection value from a first detector positioned on the first battery pack path and detecting a first module current which is an electric current flowing through the first battery module, and a second detection value from a second detector positioned on the second battery pack path and detecting a second module current which is an electric current flowing through the second battery module during a first diagnosis period during which the first positive relay and the second positive relay are in an open operational state and a diagnosis switch between a first battery pack terminal and a second battery pack terminal is in a closed operational state;

determining, by the control unit, whether the first positive relay has a stuck-closed fault based on the first detection value and a first threshold; and determining, by the control unit, whether the second positive relay has the stuck-closed fault based on the second detection value and the first threshold.

* * * * *